(12) United States Patent
Fujioka et al.

(10) Patent No.: US 8,378,467 B2
(45) Date of Patent: Feb. 19, 2013

(54) SEMICONDUCTOR DEVICE AND METHOD OF MANUFACTURING THE SAME

(75) Inventors: Chie Fujioka, Kyoto (JP); Toshiyuki Yokoe, Osaka (JP); Daichi Kumano, Kyoto (JP)

(73) Assignee: Panasonic Corporation, Osaka (JP)

( * ) Notice: Subject to any disclaimer, the term of this patent is extended or adjusted under 35 U.S.C. 154(b) by 303 days.

(21) Appl. No.: 12/934,018

(22) PCT Filed: Sep. 8, 2009

(86) PCT No.: PCT/JP2009/004423
§ 371 (c)(1), (2), (4) Date: Sep. 22, 2010

(87) PCT Pub. No.: WO2011/030368
PCT Pub. Date: Mar. 17, 2011

(65) Prior Publication Data
US 2011/0163431 A1    Jul. 7, 2011

(51) Int. Cl.
*H01L 23/495* (2006.01)

(52) U.S. Cl. .................. 257/666; 257/667; 257/E23.06; 257/E21.499; 438/106

(58) Field of Classification Search .................. 257/666, 257/667, 670, 735, E23.06, E21.499; 438/106, 438/112, 123, 124
See application file for complete search history.

(56) References Cited

U.S. PATENT DOCUMENTS

| 2005/0194423 A1 | 9/2005 | Okita |
| 2008/0265386 A1 | 10/2008 | Muto et al. |
| 2011/0163432 A1* | 7/2011 | Fujioka .................. 257/676 |

FOREIGN PATENT DOCUMENTS

| JP | 02-087536 | 3/1990 |
| JP | 04-207045 | 7/1992 |
| JP | 2000-243780 | 9/2000 |
| JP | 2004-273979 | 9/2004 |
| JP | 2008-117825 | 5/2008 |
| JP | 2008-294384 | 12/2008 |

* cited by examiner

*Primary Examiner* — Hoai V Pham
(74) *Attorney, Agent, or Firm* — Hamre, Schumann, Mueller & Larson, P.C.

(57) ABSTRACT

Retaining regions 310a and 310b are added to a pad shaped portion 303a of leads and a die pad 302 that are electrically connected via a conductive ribbon 309, so that during the bonding of the ribbon, strong ultrasonic waves can be applied in a state in which the retaining regions 310a and 310b are pressed and fixed. It is therefore possible to reduce a resistance at a joint while firmly bonding the conductive ribbon 309. Further, the bonding strength of the conductive ribbon 309 increases and thus it is possible to eliminate the need for stacking the conductive ribbons 309 and easily reduce a stress caused by ultrasonic waves on a semiconductor chip 306.

10 Claims, 4 Drawing Sheets

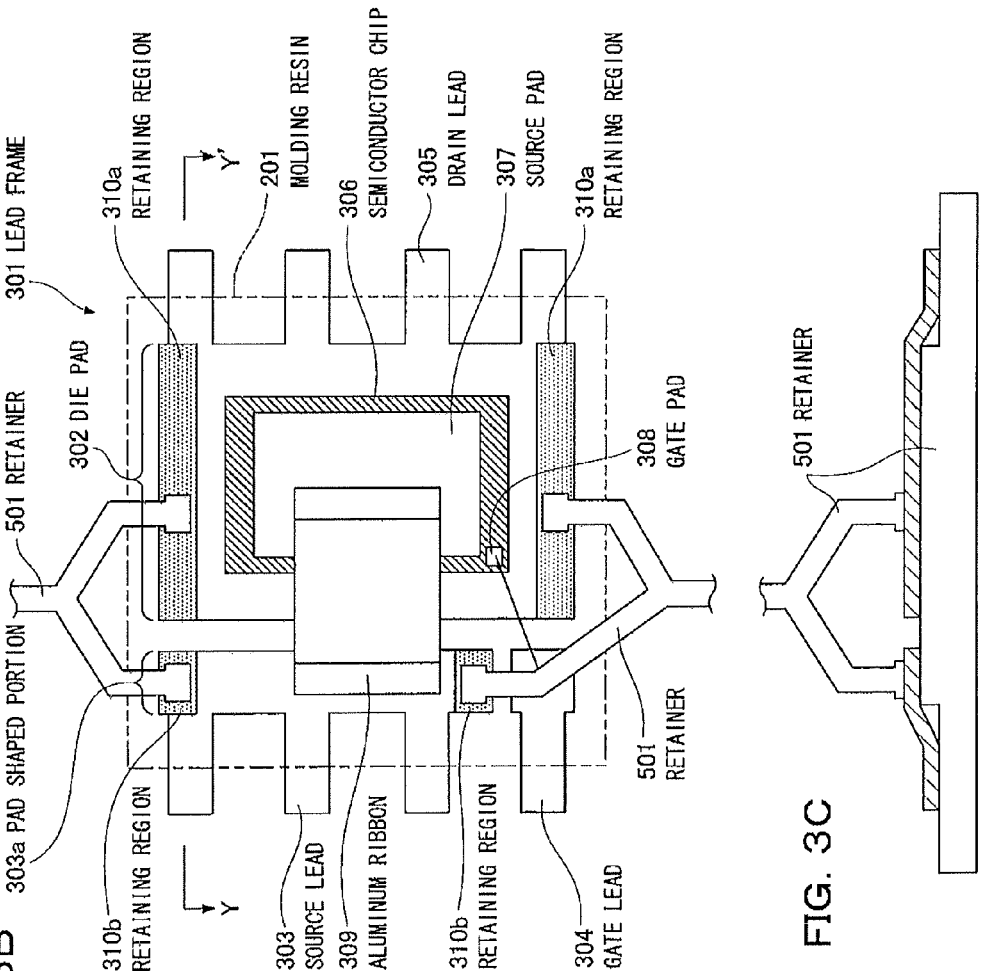
FIG. 3B
FIG. 3C
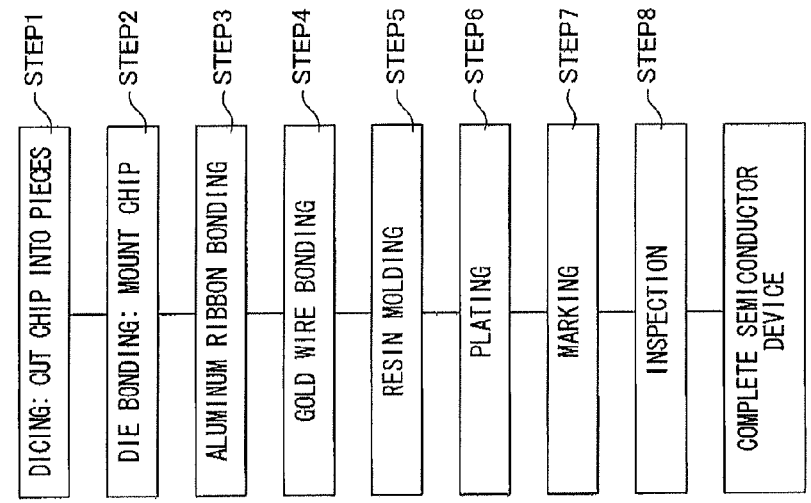
FIG. 3A

SEMICONDUCTOR DEVICE AND METHOD OF MANUFACTURING THE SAME

TECHNICAL FIELD

The present invention relates to a semiconductor device in which terminals are electrically connected via a conductive ribbon, and a method of manufacturing the same.

BACKGROUND ART

There has been an increasing demand for higher power and a higher withstand voltage in power semiconductor devices, each having a power semiconductor chip such as a MOS-FET and an IGBT mounted therein. Various semiconductor chips and packages for the semiconductor chips have been proposed in response to the demand.

In a semiconductor device and a method of manufacturing the same according to the prior art, a semiconductor chip and an external terminal are bonded with a belt of Al (aluminum ribbon) to apply a large current to the semiconductor device with a low resistance, so that an electric resistance at a joint is reduced. In recent years, in order to further reduce a resistance and obtain stable connection, multiple Al ribbons are connected in a stacked manner so as to have an increased cross sectional area.

FIG. 4 shows the connection configuration of an element electrode and an external electrode in a semiconductor device of the prior art.

In FIG. 4, a power semiconductor device 101 has a semiconductor chip 103 mounted on a lead frame 102. On the surface of the semiconductor chip 103, a source electrode 103a is formed. Further, a relatively thin conductive ribbon 105 is provided thereon and is bonded to the source electrode 103a by ultrasonic bonding. Provided on the conductive ribbon 105 is a conductive ribbon 106 larger in thickness than the conductive ribbon 105. The conductive ribbon 106 is bonded to the conductive ribbon 105 by ultrasonic bonding with the conductive ribbon 105 interposed between the conductive ribbon 106 and the source electrode 103a. The other side of the conductive ribbon 106 is similarly bonded by ultrasonic bonding with a conductive ribbon 107 interposed between the conductive ribbon 106 and a lead 108 serving as an external terminal of the lead frame 102 (e.g., see Patent Literature 1).

CITATION LIST

Patent Literature

Patent Literature 1: Japanese Patent Laid-Open No. 2008-117825

SUMMARY OF INVENTION

Technical Problem

In the configuration of the prior art, the bonding strength can be improved by increasing the cross sectional area of the Al ribbon. The relatively thin conductive ribbon 105 is first bonded to the joint by ultrasonic bonding, and then the conductive ribbon 106 larger in thickness than the conductive ribbon 105 is bonded to the conductive ribbon 105 by ultrasonic bonding. Thus disadvantageously, the semiconductor chip 103 is heated and receives a stress caused by vibrations at least twice during the ultrasonic bonding, reducing the reliability of the semiconductor chip 103. Further, the use of different kinds of conductive ribbons results in a complicated ultrasonic bonding process and a complicated device and equipment, increasing the production cost.

The present invention has been devised to solve the problems of the prior art. An object of the present invention is to easily reduce the resistance of a joint with a conductive ribbon for the electrical connection of terminals while keeping the reliability of a semiconductor chip.

Solution to Problem

In order to attain the object of the prior art, a semiconductor device of the present invention includes: a semiconductor chip; a plurality of electrode pads provided on the semiconductor chip; a die pad on which the semiconductor chip is mounted; a plurality of leads having a pad shaped portion and acting as external terminals; a conductive ribbon electrically connecting the electrode pad and the pad shaped portion; first retaining regions provided at least partially outside a region in which the semiconductor chip is mounted on the die pad and a region in which the conductive ribbon is connected; second retaining regions provided at least partially outside a region in which the conductive ribbon is connected in the pad shaped portion; and molding resin for molding the semiconductor chip, the conductive ribbon, the pad shaped portion, the first retaining regions, and the second retaining regions, wherein the first retaining regions and the second retaining regions are fixed while being pressed during the ultrasonic bonding of the conductive ribbon.

The electrode pad and the pad shaped portion may be electrically connected partially via one of a wire and a bump.

The first retaining regions may be protrusions formed on the die pad.

The first retaining regions and the second retaining regions are preferably rough surface regions in which uneven surfaces are formed.

The uneven surfaces are preferably 0.2 μm to 3 μm in depth.

The rough surface regions are preferably rectangles each having a side of at least 0.4 mm.

A method of manufacturing the semiconductor device according to the present invention, in the ultrasonic bonding of the conductive ribbon during the manufacture of the semiconductor device, the method including: disposing the conductive ribbon between the electrode pad and the pad shaped portion; fixing the first retaining regions and the second retaining regions while pressing the regions; and connecting the conductive ribbon to the electrode pad and the pad shaped portion by the ultrasonic bonding.

Preferably, the rough surface regions having uneven surfaces are formed in the first retaining regions and the second retaining regions by the fixation and pressing.

The uneven surfaces are preferably 0.2 μm to 3 μm in depth.

The rough surface regions are preferably rectangles each having a side of at least 0.4 mm.

Thus it is possible to easily reduce the resistance of a joint by using a conductive ribbon for the electrical connection of terminals while keeping the reliability of a semiconductor chip.

Advantageous Effects of Invention

As previously mentioned, retaining regions are added to the pad shaped portion of leads and a die pad that are electrically connected via a conductive ribbon, so that during the bonding of the ribbon, strong ultrasonic waves can be applied in a state in which the retaining regions are pressed and fixed. It is therefore possible to reduce a resistance at a joint while firmly bonding the conductive ribbon. Further, the bonding strength of the conductive ribbon increases and thus it is possible to eliminate the need for stacking conductive ribbons and easily reduce a stress caused by ultrasonic waves on a semiconductor chip. Moreover, the retaining regions are also molded with resin, so that the adhesion of the resin increases and the bonding strength of the conductive ribbon can be further increased by the resin.

BRIEF DESCRIPTION OF DRAWINGS

FIG. 3(a) is an explanatory drawing showing a method of manufacturing a semiconductor device according to a third embodiment.

FIG. 3(b) is an explanatory drawing showing the method of manufacturing a semiconductor device according to the third embodiment.

FIG. 3(c) is an explanatory drawing showing the method of manufacturing a semiconductor device according to the third embodiment.

DESCRIPTION OF EMBODIMENTS

The following will describe embodiments of the present invention in accordance with the accompanying drawings.
(First Embodiment)

Figure 1A:
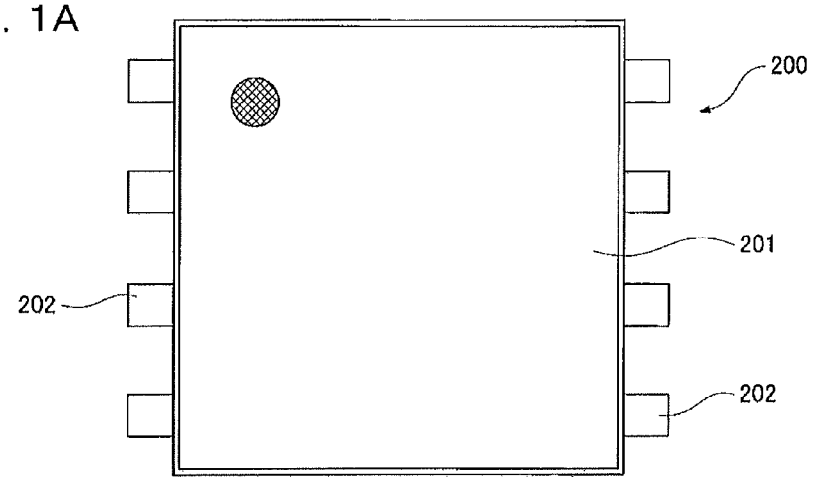
FIG. 1(a) shows the configuration of a semiconductor device according to a first embodiment.
Figure 1B:
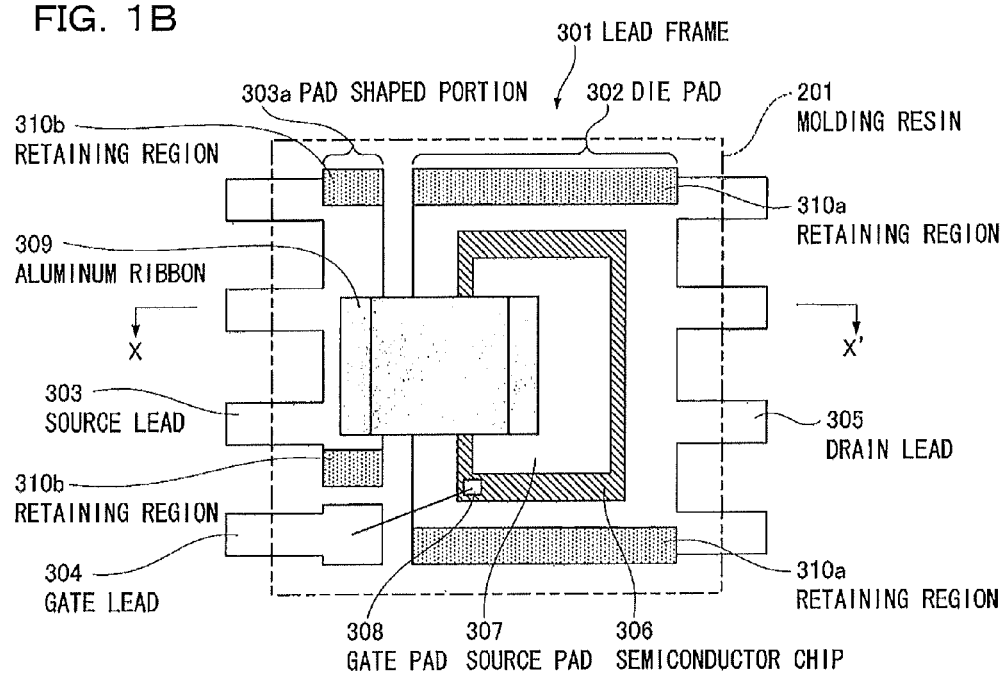
FIG. 1(b) shows the configuration of the semiconductor device according to the first embodiment.
Figure 1C:
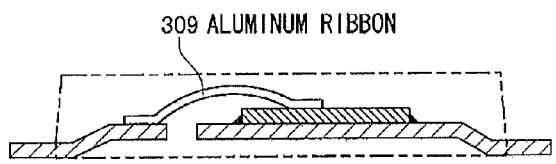
FIG. 1(c) shows the configuration of the semiconductor device according to the first embodiment.

FIG. 1 shows the configuration of a semiconductor device according to a first embodiment. FIG. 1(a) is an outside plan view showing the semiconductor device in which a semiconductor chip made up of a MOS-FET is mounted in a package called SO8P. FIG. 1(b) is an internal structural diagram of FIG. 1(a). FIG. 1(c) is a sectional view taken along line X-X' of FIG. 1(b).

As shown in FIG. 1, a semiconductor device 200 has outer lead terminals 202 protruding from molding resin 201, and is connected to an external circuit and a substrate via the outer lead terminals 202.

A lead frame 301 is formed of a die pad 302, source leads 303, and a gate lead 304. The source leads 303 and the gate lead 304 are opposed to the die pad in a separated manner. From the die pad 302, a plurality of leads are drawn and act as drain leads 305. The source leads 303 have a pad shaped portion 303a that is a combination of the multiple leads near the die pad.

The die pad 302, the pad shaped portion 303a of the source leads 303, and the die-pad side end of the gate lead 304 are bent and are placed slightly higher than outer lead portions. The die pad 302, the pad shaped portion 303a of the source leads 303, and the die-pad side end of the gate lead 304 may be flush with one another or the die pad 302 may be placed slightly lower.

The lead frame 301 is mainly made of copper (Cu) or a copper alloy. Generally, a die pad portion is normally coated with silver (Ag) and the pad shaped portion 303a of the source leads may be made of solid copper (Cu) without plating. Alternatively, the pad shaped portion 303a may be plated with silver (Ag) or nickel (Ni). The die-pad side end of the gate lead 304 is normally plated with silver (Ag).

On the die pad 302, for example, a semiconductor chip 306 of a power MOS-FET is mounted and is bonded on the die pad 302 by using a die bonding material such as solder and silver (Ag) paste. The die bonding material for bonding is not limited to solder and silver (Ag) paste as long as drain electrodes on the back side of the semiconductor chip 306 and the die pad 302 are electrically connected to each other.

Formed on the semiconductor chip 306 are a source pad 307 connected to a source electrode and a gate pad 308 connected to a gate electrode. The source pad 307 and the gate pad 308 are rectangular, and the source pad 307 is larger than the gate pad 308. The gate pad 308 on the semiconductor chip 306 and the pad shaped portion 303a of the gate leads 304 are connected via gold (Au) wires. The source pad 307 on the semiconductor chip 306 and the source leads 303 opposed to the source pad 307 are connected via an aluminum ribbon 309 and the aluminum ribbon 309 is bonded to the source pad 307 and the pad shaped portion 303a by ultrasonic bonding. Since the aluminum ribbon 309 is bonded using ultrasonic waves, retaining regions 310a are provided at least partially on the ends of the die pad 302 on which the semiconductor chip 306 is mounted. The retaining regions 310a do not contain the semiconductor chip 306, the die bonding material, or the aluminum ribbon 309. During ultrasonic bonding, the die pad 302 can be fixed by the retaining regions 310a. Further, on the pad shaped portion 303a of the source leads 303, retaining regions 310b to which the aluminum ribbon 309 is not connected are provided on both ends of the connected portion of the pad shaped portion.

The retaining regions 310a and 310b on the lead frame 301 make it possible to firmly hold the lead frame 301 during the bonding of the aluminum ribbon, thereby effectively transmitting strong ultrasonic waves to the lead frame 301 and the aluminum ribbon 309 so as to firmly fix the aluminum ribbon 309. Further, the molding resin 201 is formed so as to contain the additional retaining regions 310a and 310b, so that the contact area between the lead frame 301 and the molding resin 201 increases and the aluminum ribbon 309 can be firmly fixed by the molding resin 201 without stacking the aluminum ribbons 309. Thus a resistance at a joint can be easily reduced by the conductive ribbon for the electrical connection of the terminals while keeping the reliability of the semiconductor chip. Moreover, in a case where the lead frame 301 is held by fixation while being pressed, rough surface regions with a depth of about 0.2 μm to 3 μm are formed in the retaining regions 310a and 310b, so that the contact area between the lead frame 301 and the molding resin 201 can be enlarged and the adhesion of the molding resin 201 to the lead frame 301 can be increased. Thus it is possible to more firmly fix the aluminum ribbon 309 and simultaneously reduce the entry of moisture or the like from the outside.

The aluminum ribbon 309 is bonded in a state in which the die pad 302 is sucked from the underside thereof and the bridge portion of the lead frame 301 is fixed. In a typical method of fixing the lead frame 301 according to the prior art, it is not possible to effectively transmit strong ultrasonic waves or sufficiently fix the lead frame 301, though it is necessary to effectively transmit strong ultrasonic waves and minimize the resonance of the lead frame 301 in the bonding of the aluminum ribbon 309. For this reason, a bonding strength may be insufficient at the interface between the aluminum ribbon 309 and source pad 307 and the interface between the aluminum ribbon 309 and the source lead 303, or the aluminum ribbon 309 may be insufficiently bonded.

Thus the aluminum ribbon 309 is bonded by ultrasonic bonding in a state in which the lead frame 301 is firmly fixed at the die pad 302 provided with the retaining regions 310a and 310b and the pad shaped portion 303a of the source leads 303, so that the aluminum ribbon 309 is firmly bonded and the contact area of the molding resin 201 is increased. Thus it is possible to increase the adhesion of the molding resin 201 and stably connect the aluminum ribbon 309. The formation of the rough surface regions can further increase the adhesion of the molding resin 201 and more stably connect the aluminum ribbon 309.

In order to firmly fix the lead frame 301 with the retainer of a bonder, the retaining regions of a typical power semiconductor device require dimensions of at least 0.4 mm×0.4 mm in consideration of the dimension of the retainer, the accuracy of transportation and so on, and the dimensions of the formed rough surface regions that are expected to be effective. The die bonding material should not be expanded to this region. If the die bonding material expands to this region, the die bonding material is also fixed by the retainer, so that ultrasonic waves may cause exfoliation at the interface between the chip 306 and the die pad 302 and the formation of the rough surface regions may be hampered.

The aluminum ribbon 309 is a belt of aluminum and transmits a large current with a low resistance. The material of the ribbon is not particularly limited as long as the ribbon is a belt of a conductive material with the same effect.

(Second Embodiment)

Figure 2:
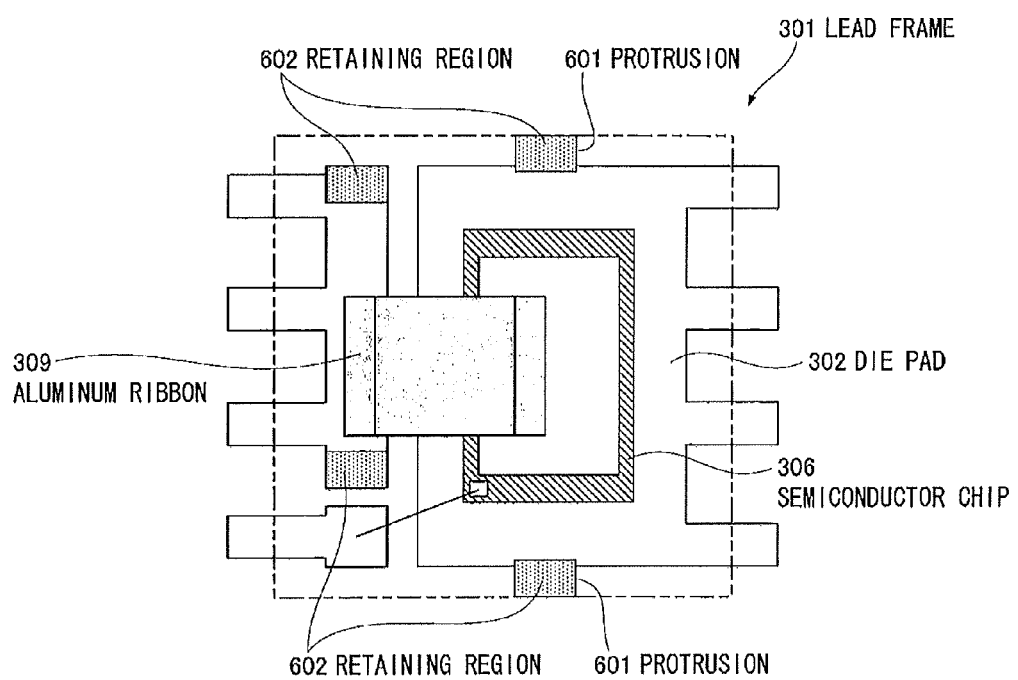
FIG. 2 is a plan view showing the internal configuration of a semiconductor device according to a second embodiment.
Figure 4:
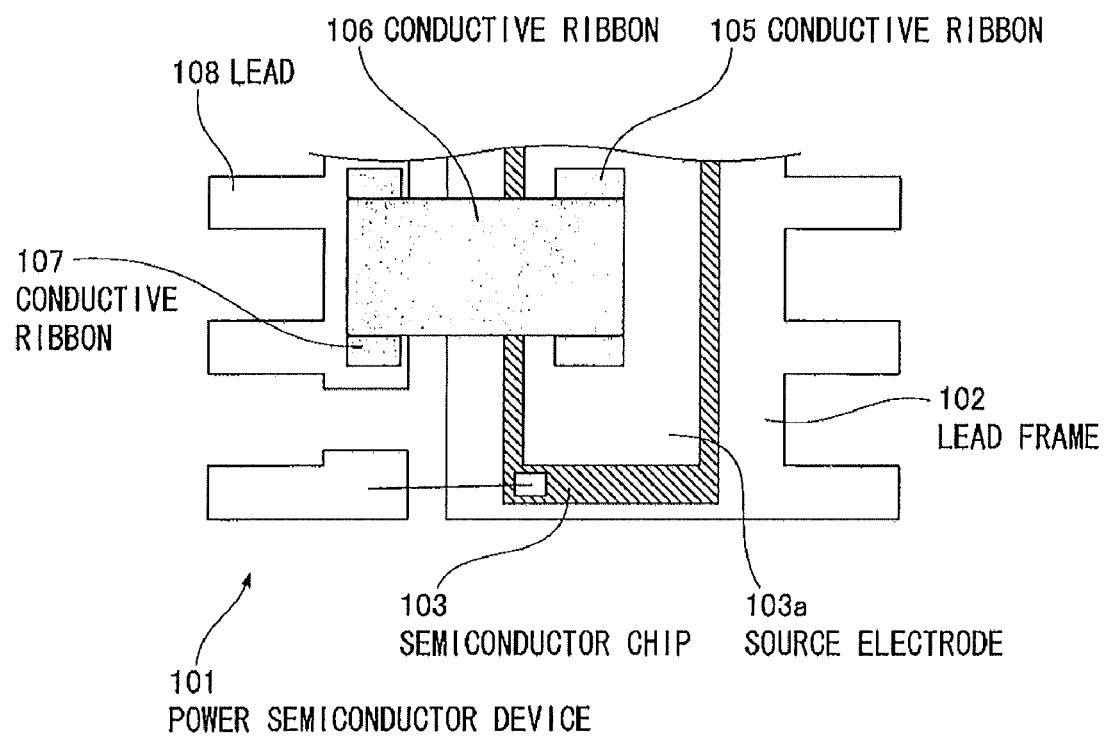
FIG. 4 shows the connection configuration of an element electrode and an external electrode in a semiconductor device of the prior art.

FIG. 2 is a plan view showing the internal configuration of a semiconductor device according to a second embodiment. In FIG. 2, the same constituent elements as in FIG. 1 are indicated by the same reference numerals and the explanation thereof is omitted.

In FIG. 2, protrusions 601 are provided on a die pad 302. The protrusions 601 act as retaining regions 602 during ultrasonic bonding. The protrusions 601 are firmly fixed by the retainer of a bonder for an aluminum ribbon 309, so that rough surface regions with a depth of about 0.2 μm to 3 μm can be formed by a pressing force. The protrusions 601 also require dimensions of at least 0.4 mm×0.4 mm. This configuration can eliminate the need for retaining regions on the die pad 302 and the protrusions 601 can be pressed by the retainer instead. Thus the size of a semiconductor chip 306 mounted on the die pad 302 is not limited by retaining regions of 0.4 mm×0.4 mm, achieving more flexible design.

Further, a die bonding material expanding substantially concentrically with the die pad 302 at the center is hard to extend to the protrusions 601 that protrude from the die pad 302. In order to more effectively prevent a die pad material from expanding to the protrusions 601, uneven portions may be provided on the surfaces of the protrusions 601 or a coating may be partially applied to the protrusions 601. Thus it is not necessary to consider the expansion of the die bond material to the protrusions 601. Consequently, it is not necessary to consider exfoliation at the interface between the semiconductor chip and the die pad, the exfoliation being caused by ultrasonic bonding with an excessive die bonding material fixed by the retainer.

The protrusions 601 are provided on the die pad 302 and ultrasonic bonding is performed in a state in which the protrusions 601 are fixed by the retainer, so that strong ultrasonic waves can be effectively transmitted and the resonance of a lead frame 301 can be minimized in a semiconductor device of, e.g., a MOS-FET power system. Thus it is possible to firmly bond the aluminum ribbon 309. Further, adhesion with resin can be increased by the rough surface regions formed by a pressing force of the retainer, achieving the semiconductor device having the aluminum ribbon 309 formed with higher bonding reliability.

(Third Embodiment)

FIG. 3 is an explanatory drawing showing a method of manufacturing a semiconductor device according to a third embodiment. FIG. 3(a) is a process flowchart showing the method of manufacturing the semiconductor device according to the present invention. FIG. 3(b) is a plan view for explaining the bonding process of a conductive ribbon in the process flowchart of FIG. 3(a). FIG. 3(c) is a sectional view taken along line Y-Y' of FIG. 3(b).

In FIG. 3, first, a power MOS-FET is formed on a silicon wafer, and then the wafer is divided into pieces in a dicing process, so that a semiconductor chip 306 is formed (step 1). Next, by using a lead frame 301 in which a die pad and leads are formed, bending is performed on a die pad 302, a pad shaped portion 303a of source leads 303, and the die-pad side end of a gate lead 304 by pre-bending. After that, the semiconductor chip 306 is mounted on the die pad by using a die bonding material such as silver (Ag) paste (step 2). Next, on a source pad 307 on the semiconductor chip 306 and the pad shaped portion 303a that is a combination of the source leads 303, an aluminum ribbon 309 is bonded using ultrasonic waves (step 3). At this point, retaining regions 310a and 310b provided on the die pad 302 and the source leads 303 are firmly fixed by retainers 501 of a bonder, and then the aluminum ribbon 309 is bonded. Simultaneously, rough surface regions with a depth of about 0.2 μm to 3 μm may be formed by a pressing force of the retainer. After that, a gate pad 308 on the semiconductor chip 306 and the gate lead 304 are connected via gold (Au) wires (step 4). Although aluminum ribbon bonding and gold wire bonding may be performed in any order, it is desirable to first bond the aluminum ribbon in consideration of a pressing method and strong ultrasonic waves in the bonding of the aluminum ribbon 309.

Next, the die pad 302, the semiconductor chip 306, the aluminum ribbon 309, the gold wires, and inner leads are molded with molding resin 201 (step 5). After a plating process (step 6) and a marking process (step 7), an inspection process of checking the quality of the semiconductor device is performed (step 8), so that the semiconductor device is completed.

In the semiconductor device manufactured by the manufacturing method, the retaining regions 310a and 310b for ultrasonic bonding on the aluminum ribbon 309 are provided on the die pad 302 and the pad shaped portion 303a. Thus it is possible to effectively transmit strong ultrasonic waves and minimize the resonance of the lead frame 301, firmly bonding the aluminum ribbon 309. Further, it is not necessary to stack the aluminum ribbons 309 or perform ultrasonic bonding several times, so that a stress to the semiconductor chip 306 can be reduced and the semiconductor chip 306 can be obtained with reliability. Moreover, a contact area between the lead frame and the resin can be increased by the rough surface regions that are formed by a pressing force of the retainer 501, thereby increasing adhesion with the resin. With this configuration, the semiconductor device can be obtained with high bonding reliability.

In the explanation of the foregoing embodiments, a power semiconductor device was described as a semiconductor device. The present invention is not limited to a power semiconductor device and may be implemented for various semiconductor devices by providing retaining regions partially or entirely on leads and a die pad with a conductive ribbon electrically connecting terminals and leads. Moreover, any number of terminals may be used and the connection types of the conductive ribbon, wires, bumps, and so on may be optionally combined. In the foregoing explanation, the back side of the semiconductor chip and the die pad are directly and electrically connected to each other. However, it is not always necessary to connect the back side of the semiconductor chip.

Industrial Applicability

The present invention makes it possible to easily reduce a resistance at a joint by using a conductive ribbon for the electrical connection of terminals while keeping the reliability of a semiconductor chip. The present invention is useful for a semiconductor device in which terminals are electrically connected via a conductive ribbon, and a method of manufacturing the same.

The invention claimed is:

1. A semiconductor device comprising:
   a semiconductor chip;
   a plurality of electrode pads provided on the semiconductor chip;
   a die pad on which the semiconductor chip is mounted;
   a plurality of leads having a pad shaped portion and acting as external terminals;
   a conductive ribbon electrically connecting the electrode pad and the pad shaped portion;
   first retaining regions provided at least partially outside a region in which the semiconductor chip is mounted on the die pad and a region in which the conductive ribbon is connected;
   second retaining regions provided at least partially outside a region in which the conductive ribbon is connected in the pad shaped portion; and
   molding resin for molding the semiconductor chip, the conductive ribbon, the pad shaped portion, the first retaining regions, and the second retaining regions,
   wherein the first retaining regions and the second retaining regions are fixed while being pressed during ultrasonic bonding of the conductive ribbon.

2. The semiconductor device according to claim 1, wherein the electrode pad and the pad shaped portion are electrically connected partially via one of a wire and a bump.

3. The semiconductor device according to claim 1, wherein the first retaining regions are protrusions formed on the die pad.

4. The semiconductor device according to claim 1, wherein the first retaining regions and the second retaining regions are rough surface regions in which uneven surfaces are formed.

5. The semiconductor device according to claim 4, wherein the uneven surfaces are 0.2 μm to 3 μm in depth.

6. The semiconductor device according to claim 4, wherein the rough surface regions are rectangles each having a side of at least 0.4 mm.

7. A method of manufacturing a semiconductor device,
   in ultrasonic bonding of the conductive ribbon during manufacture of the semiconductor device according to claim 1, the method comprising:
   disposing the conductive ribbon between the electrode pad and the pad shaped portion;
   fixing the first retaining regions and the second retaining regions while pressing the regions; and
   connecting the conductive ribbon to the electrode pad and the pad shaped portion by the ultrasonic bonding.

8. The method of manufacturing a semiconductor device according to claim 7, wherein rough surface regions having uneven surfaces are formed in the first retaining regions and the second retaining regions by the fixation and pressing.

9. The method of manufacturing a semiconductor device according to claim 8, wherein the uneven surfaces are 0.2 μm to 3 μm in depth.

10. The method of manufacturing a semiconductor device according to claim 8, wherein the rough surface regions are rectangles each having a side of at least 0.4 mm.

* * * * *